United States Patent
Yamamoto

(10) Patent No.: US 10,928,806 B2
(45) Date of Patent: Feb. 23, 2021

(54) DEVICE FOR CONTROLLING SUBSTRATE PROCESSING APPARATUS AND METHOD FOR DISPLAYING SUBSTRATE PROCESSING

(71) Applicant: Tokyo Electron Limited, Tokyo (JP)

(72) Inventor: Satoko Yamamoto, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 158 days.

(21) Appl. No.: 15/918,011

(22) Filed: Mar. 12, 2018

(65) Prior Publication Data

US 2018/0267512 A1    Sep. 20, 2018

(30) Foreign Application Priority Data

Mar. 15, 2017    (JP) .............................. JP2017-050466

(51) Int. Cl.
  *G05B 19/4155* (2006.01)
  *G05B 19/418* (2006.01)
  *H01L 21/67* (2006.01)

(52) U.S. Cl.
  CPC ... *G05B 19/4155* (2013.01); *G05B 19/41865* (2013.01); *G05B 2219/45031* (2013.01); *H01L 21/67167* (2013.01)

(58) Field of Classification Search
  None
  See application file for complete search history.

(56) References Cited

U.S. PATENT DOCUMENTS

2011/0139749 A1* 6/2011 Yamazaki ......... H01J 37/32935
                                                         216/59
2014/0379113 A1* 12/2014 Yamamoto ....... G05B 19/41865
                                                         700/110

FOREIGN PATENT DOCUMENTS

| EP | 2579190 A1 * | 4/2013 |
| JP | H11-219875 | 8/1999 |
| JP | 2005-260108 | 9/2005 |
| JP | 2008-159787 | 7/2008 |
| JP | 2009-164633 | 7/2009 |
| JP | 2010-263017 | 11/2010 |
| JP | 2012-216630 | 11/2012 |
| JP | 2014-116545 | 6/2014 |

* cited by examiner

Primary Examiner — Mohammad Ali
Assistant Examiner — Sheela Rao
(74) Attorney, Agent, or Firm — IPUSA, PLLC

(57) ABSTRACT

A device controls a substrate processing apparatus that includes process modules for processing substrates. The device includes a memory that stores a program, and a processor that executes the program stored in the memory to perform a process. The process includes receiving a substrate processing recipe defining substrate processing and multiple conditioning recipes defining conditioning processes, generating a system recipe indicating an execution procedure of the received substrate processing recipe and the received conditioning recipes, and before controlling the substrate processing apparatus to process the substrates according to the system recipe, chronologically displaying an execution order of the substrate processing and the conditioning processes for each of the process modules based on the system recipe.

9 Claims, 20 Drawing Sheets

FIG.4

| ROUTE | | | | | | | |
|---|---|---|---|---|---|---|---|
| # | MODULE | CLEANING TIMING | INDIVIDUAL SETTING | CLEANING RECIPE (COMMON) | PRE-PROCESS CLEANING RECIPE | COUNT DESIGNATION CLEANING RECIPE | POST-PROCESS CLEANING RECIPE |
| 2 | LLM1 OR LLM2 | | | | | | |
| 3 | PM1 | PRE&POST-PROCESS 5 WAFERS | RECIPE INDIVIDUAL | | PRE-CLEAN | CLEAN-AFTER-PROC | POST-CLEAN |
| 4 | LLM1 OR LLM2 | | | | | | |

|   | CATEGORY | MODULE |
|---|----------|--------|
| 1 | START    | LPC    |
| 2 | IN       | LLM1 OR LLM2 |
| 3 | PROCESS  | PM1 OR PM2 |
| 4 | OUT      | LLM1 OR LLM2 |
| 5 | END      | LPC    |

A4

INSERT　DELETE

FIG.10A

| ROUTE | | | | | | | | |
|---|---|---|---|---|---|---|---|---|
| # | MODULE | CLEANING TIMING | INDIVIDUAL SETTING | CLEANING RECIPE (COMMON) | PRE-PROCESS CLEANING RECIPE | COUNT DESIG-NATION CLEANING RECIPE | POST-PROCESS CLEANING RECIPE | A5 |
| 2 | LLM1 OR LLM2 | | | | | | | |
| 3 | PM1 | PRE&POST-PROCESS 5 WAFERS | RECIPE INDIVIDUAL | | /PRE-CLEAN | /CLEAN-AFTER-PROC | /POST-CLEAN | |
| 3 | PM2 | PRE&POST-PROCESS 5 WAFERS | RECIPE INDIVIDUAL | | /PRE-CLEAN | /CLEAN-AFTER-PROC | /POST-CLEAN | |
| 3 | PM3 | PRE&POST-PROCESS 5 WAFERS | RECIPE INDIVIDUAL | | /PRE-CLEAN | /CLEAN-AFTER-PROC | /POST-CLEAN | |
| 3 | PM4 | PRE&POST-PROCESS 5 WAFERS | RECIPE INDIVIDUAL | | /PRE-CLEAN | /CLEAN-AFTER-PROC | /POST-CLEAN | |
| 3 | PM5 | PRE&POST-PROCESS 5 WAFERS | RECIPE INDIVIDUAL | | /PRE-CLEAN | /CLEAN-AFTER-PROC | /POST-CLEAN | |

FIG.12A

ROUTE

| # | MODULE | CLEANING TIMING | INDIVIDUAL SETTING | CLEANING RECIPE (COMMON) | PRE-PROCESS CLEANING RECIPE | COUNT DESIGNATION CLEANING RECIPE | POST-PROCESS CLEANING RECIPE A5 |
|---|---|---|---|---|---|---|---|
| 2 | LLM1 OR LLM2 | | | | | | |
| 3 | PM1 | PRE&POST-PROCESS 5 WAFERS | RECIPE INDIVIDUAL | | /PRE-CLEAN | /CLEAN-AFTER-PROC | /POST-CLEAN |
| 3 | PM2 | PRE&POST-PROCESS 5 WAFERS | RECIPE INDIVIDUAL | | /PRE-CLEAN | /CLEAN-AFTER-PROC | /POST-CLEAN |
| 3 | PM3 | PRE&POST-PROCESS 5 WAFERS | RECIPE INDIVIDUAL | | /PRE-CLEAN | /CLEAN-AFTER-PROC | /POST-CLEAN |
| 3 | PM4 | PRE&POST-PROCESS 5 WAFERS | RECIPE INDIVIDUAL | | /PRE-CLEAN | /CLEAN-AFTER-PROC | /POST-CLEAN |
| 3 | PM5 | PRE&POST-PROCESS 5 WAFERS | RECIPE INDIVIDUAL | | /PRE-CLEAN | /CLEAN-AFTER-PROC | /POST-CLEAN |

| PARAMETERS | | A8 |
|---|---|---|
| 1 | ----- | DISABLED |
| 2 | ----- | DISABLED |
| 3 | ----- | DISABLED |
| 4 | ----- | DISABLED |
| 5 | PM-USE-COUNT CLEANING FUNCTION | ENABLED |
| 6 | ----- | DISABLED |

FIG.15

SYSTEM-RECIPE2 – TRANSFER IMAGE (ROUTE 3)

PRODUCTION WAFERS TO TRANSFER: 25

| NO. | WAFER | PM1 WAFERLESS | TYPE | ESTIMATED PROCESSING TIME |
|---|---|---|---|---|
|  |  | DISCHARGE |  | ○○ |
| 1 | SEASONING-1 | ⎫ 153 | DUMMY WAFER |  |
| 1 | PRO-PM1 |  |  |  |
| 1 | PRO-PM1 |  |  |  |
| 1 | PRO-PM1 |  |  |  |
| 1 | PRO-PM1 |  |  |  |
| 1 | PRO-PM1 | ⎬ 154 | PRODUCT WAFER |  |
| 1 | PRO-PM1 |  |  |  |
| 1 | PRO-PM1 |  |  |  |
| 1 | PRO-PM1 |  |  |  |
| 1 | PRO-PM1 |  |  |  |
| 1 | PRO-PM1 |  |  |  |
| 1 | (SSC) CLEAN-AFTER-PROC | 155 | DUMMY WAFER |  |
| 0 |  | NPPC 156 |  |  |
| 1 | (SSC) SEASONING-1 | 157 | DUMMY WAFER |  |
| 1 | PRO-PM1 |  |  |  |
| 1 | PRO-PM1 |  |  |  |
| 1 | PRO-PM1 |  |  |  |
| 1 | PRO-PM1 |  |  |  |
| 1 | PRO-PM1 | ⎬ 158 | PRODUCT WAFER |  |
| 1 | PRO-PM1 |  |  |  |
| 1 | PRO-PM1 |  |  |  |
| 1 | PRO-PM1 |  |  |  |
| 1 | PRO-PM1 |  |  |  |
| 1 | PRO-PM1 |  |  |  |
| 1 | (SSC) CLEAN-AFTER-PROC | 159 | DUMMY WAFER |  |
| 0 |  | NPPC 160 |  |  |
| 1 | (SSC) SEASONING-1 | 161 | DUMMY WAFER |  |
| 1 | PRO-PM1 |  |  |  |
| 1 | PRO-PM1 |  |  |  |
| 1 | PRO-PM1 | ⎬ 162 | PRODUCT WAFER |  |
| 1 | PRO-PM1 |  |  |  |
| 1 | PRO-PM1 |  |  |  |
| 1 | (SSC) CLEAN-AFTER-PROC | 163 | DUMMY WAFER |  |
|  |  | NPPC 164 |  |  |

WAFER — PROCESS: ▒  CLEANING: ▨  DUMMY: ▧

WAFERLESS — WLDC: ▒  CHAMBER CONDITIONING: ▭  NPPC: ▩

SMART CONDITIONING — DRY CLEANING: ▨  NPPC: ▩  SEASONING: ▧

DEVICE FOR CONTROLLING SUBSTRATE PROCESSING APPARATUS AND METHOD FOR DISPLAYING SUBSTRATE PROCESSING

CROSS-REFERENCE TO RELATED APPLICATION

The present application is based upon and claims the benefit of priority of Japanese Patent Application No. 2017-050466, filed on Mar. 15, 2017, the entire contents of which are incorporated herein by reference.

BACKGROUND OF THE INVENTION

1. Field of the Invention

An aspect of this disclosure relates to a device for controlling a substrate processing apparatus and a method for displaying substrate processing.

2. Description of the Related Art

A wafer transfer sequence indicating transfer routes for transferring substrates to process modules in a substrate processing apparatus is determined based on predetermined parameters, a system recipe created and edited by a user, the number of wafers to be processed, and other conditions. If the determined transfer sequence is visually presented, the user can easily recognize the transfer routes. Japanese Laid-Open Patent Publication No. 2005-260108 and Japanese Laid-Open Patent Publication No. 2009-164633, for example, propose technologies for visually presenting a determined transfer sequence to a user.

For example, Japanese Laid-Open Patent Publication No. 2005-260108 discloses a substrate processing system that enables an operator specifying the order of transfer to visually display transfer routes and to display an animation of a specified route. Also, Japanese Laid-Open Patent Publication No. 2009-164633 discloses a technology that enables a user creating an operation recipe to visually recognize the movement of objects with respect to multiple chambers and thereby enables the user to correctly and easily create an operation recipe.

However, Japanese Laid-Open Patent Publication No. 2005-260108 and Japanese Laid-Open Patent Publication No. 2009-164633 only disclose technologies for visually displaying transfer routes of respective substrates according to a set recipe and do not disclose technologies for visually displaying the order of processing such as substrate processing and cleaning processing performed in process modules.

When items that can be set in a system recipe and conditions that can be set using parameters become complex, it becomes difficult to understand the order of processing executed in process modules. Also, when concurrent processing can be performed using multiple process modules or conditioning processes require different processing times, it becomes more difficult to understand the order of substrate processing and multiple conditioning processes performed in each process module.

It is desirable for a user to be able to recognize the order in which substrate processing and conditioning processes are performed and determine whether an intended system recipe has been created before executing the system recipe.

SUMMARY OF THE INVENTION

In an aspect of this disclosure, there is provided a device for controlling a substrate processing apparatus that includes process modules for processing substrates. The device includes a memory that stores a program, and a processor that executes the program stored in the memory to perform a process. The process includes receiving a substrate processing recipe defining substrate processing and multiple conditioning recipes defining conditioning processes, generating a system recipe indicating an execution procedure of the received substrate processing recipe and the received conditioning recipes, and before controlling the substrate processing apparatus to process the substrates according to the system recipe, chronologically displaying an execution order of the substrate processing and the conditioning processes for each of the process modules based on the system recipe.

BRIEF DESCRIPTION OF THE DRAWINGS

FIG. 4 is a drawing illustrating an example of a system recipe setting screen;

FIG. 7 is a drawing illustrating an example of a route setting screen;

FIG. 10A is a drawing illustrating a system recipe setting screen according to a first variation;

FIG. 12A is a drawing illustrating a system recipe setting screen according to a second variation;

FIG. 15 is a drawing illustrating an example of an execution order display screen displayed based on conditions set in FIGS. 14A and 14B;

DESCRIPTION OF THE PREFERRED EMBODIMENTS

An aspect of this disclosure provides a device for controlling a substrate processing apparatus and a method for displaying substrate processing that make it possible to easily recognize the sequence of processes executed in a process module before actually performing substrate processing according to a system recipe.

Embodiments of the present invention are described below with reference to the accompanying drawings. Throughout the specification and the drawings, the same reference number is assigned to substantially the same components, and repeated descriptions of those components are omitted.

<Hardware Configuration>

Figure 1:
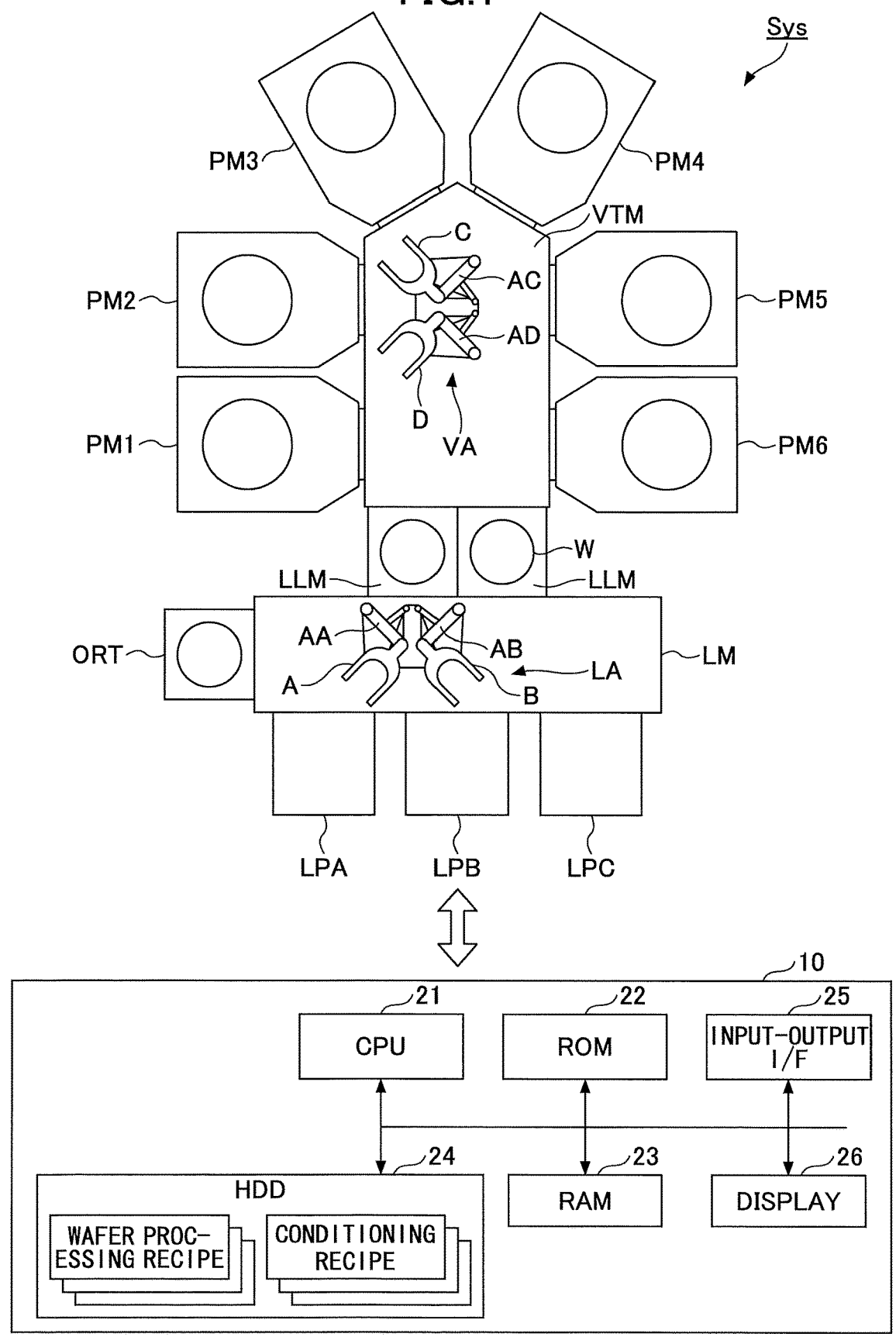
FIG. 1 is a drawing illustrating examples of hardware configurations of a substrate processing apparatus and a control device.

Examples of hardware configurations of a substrate processing apparatus Sys and a control device according to an embodiment are described with referent t FIG. 1. FIG. 1 is a drawing illustrating examples of hardware configurations of the substrate processing apparatus Sys and the control device 10. The substrate processing apparatus Sys is an example of a substrate processing system having a cluster structure (multi-chamber structure).

The substrate processing apparatus Sys includes six process modules PM1 through PM6, a vacuum transfer module VTM, two load lock modules LLM, a loader module LM, and three load ports LP. The load ports LP include a load port LPA, a load port LPB, and a load port LPC from left to right in FIG. 1. The substrate processing apparatus Sys is controlled by the control device 10.

The process modules PM1 through PM6 are disposed around the vacuum transfer module VTM and are used to process wafers. Each of the process modules PM is connected via a gate valve to the vacuum transfer module VTM. In each of the process modules PM1 through PM6, the pressure is reduced to a predetermined vacuum pressure, and processes such as plasma/non-plasma etching, film deposition, cleaning, and ashing are performed on a wafer. The process modules PM1 through PM6 may be collectively referred to as process modules PM.

A transfer device VA for transferring wafers is provided in the vacuum transfer module VTM. The transfer device VA includes robot arms AC and AD that can extend, retract, and rotate. Picks C and D are attached to the ends of the robot arms AC and AD, respectively. The transfer device VA can hold wafers on the picks C and D. The transfer device VA is configured to carry wafers into and out of the process modules PM1 through PM6, and into and out of the load lock modules LLM.

The load lock modules LLM are disposed between the vacuum transfer module VTM and the loader module LM. The pressure in the load lock modules LLM can be switched between the atmospheric pressure and the vacuum pressure to transfer a wafer from the loader module LM with the atmospheric pressure to the vacuum transfer module VTM with the vacuum pressure and to transfer a wafer from the vacuum transfer module VTM with the vacuum pressure to the loader module LM with the atmospheric pressure. In the present embodiment, two load lock modules LLM are provided. In the descriptions below, one of the load lock modules LLM may be referred to as a load lock module LLM1 and another one of the load lock modules LLM may be referred to as a load lock module LLM2.

The inside of the loader module LM is kept clean by using an ultra-low penetration air (ULPA) filter and a down flow system, and is adjusted at a pressure that is slightly greater than the atmospheric pressure. The load ports LPA, LPB, and LPC are provided on a longer side of the loader module LM. For example, a front opening unified pod (FOUP) containing 25 wafers or an empty FOUP may be attached to each of the load ports LPA, LPB, and LPC. The load ports LPA, LPB, and LPC are entrances/exits through which wafers W are carried into the process modules PM and the wafers W processed in the process modules PM are carried out.

A transfer device LA for transferring wafers is provided in the loader module LM. The transfer device LA includes robot arms AA and AB that can extend, retract, and rotate. Picks A and B are attached to the ends of the robot arms AA and AB, respectively. The transfer device LA can hold wafers on the picks A and B. The transfer device LA is configured to carry wafers into and out of the FOUPs, and into and out of the load lock modules LLM.

An orientor ORT for detecting the position of a wafer is provided for the loader module LM. The orientor ORT is disposed at an end of the loader module LM in the longitudinal direction. The orientor ORT detects the center position, the eccentricity, and the notch position of a wafer. Each of the robot arms AA and AB of the loader module LM corrects the position of the wafer based on the detection results.

Specifically, each of the robot arms AA and AB takes an unprocessed wafer out of a FOUP attached to the load port LP, and carries the wafer to the orientor ORT. After the position of the wafer is corrected by the loader module LM based on detection results of the orientor ORT, the robot arm AA/AB carries the wafer into the load lock module LLM. Also, each of the robot arms AA and AB takes a processed wafer processed in the process module PM out of the load lock module LLM and places the wafer in a FOUP.

The number of the process modules PM, the number of the load lock modules LLM, the number of the loader modules LM, and the number of the load ports LP are not limited to those described in the present embodiment.

The control device 10 includes a central processing unit (CPU) 21, a read-only memory (ROM) 22, a random access memory (RAM) 23, a hard disk drive (HDD) 24, an input-output interface (I/F) 25, and a display 26. The control device 10 may include another type of storage such as a solid state drive (SSD) instead of or in addition to the HDD 24.

The CPU 21 controls wafer processing and various conditioning processes in each process module PM according to a system recipe generated from recipes selected from wafer processing recipes and conditioning recipes stored in the HDD 24.

A system recipe indicates an execution procedure of a wafer processing recipe defining a procedure and conditions of wafer processing and conditioning recipes defining procedures for conditioning the process module PM. The type of substrate used in a wafer processing recipe is a product wafer, and the type of substrate used in a conditioning recipe is a dummy wafer or no wafer (wafer-less).

The multiple conditioning recipes include at least one of recipes for executing dry cleaning, wafer-less dry cleaning (WLDC), seasoning, non-plasma particle cleaning (NPPC), and a lot stabilization process.

In the dry cleaning, a product wafer is carried out of a process module, a dummy wafer is carried into the process module, and unnecessary deposits in the process module are removed using plasma. In the wafer-less dry cleaning, a product wafer is carried out of a process module, and plasma is generated without placing a dummy wafer in the process module to, for example, remove static electricity from a stage on which wafers are placed. The seasoning is a dummy process performed after the dry cleaning to condition the atmosphere in the process module.

NPPC is performed to remove particles in the process modules PM and the load lock modules LLM. NPPC is performed based on a product of a high-frequency discharging time and the number of times a process module PM is used. However, if NPPC is performed every time when the product reaches a fixed threshold, the throughput is reduced. For this reason, there is a function to specify in a system recipe whether to perform NPPC so that NPPC is performed when a particular lot is completed. When NPPC is performed after a product wafer is processed and before cleaning processes are performed, a large amount of particles may be generated. For this reason, a system recipe is generated such that NPPC is performed after cleaning processes are performed. Also, the timing of executing wafer processing and conditioning processes, the order of priority of processes, and various conditions are considered when generating a system recipe. The lot stabilization process is performed on a dummy wafer before product processing including plasma processing is performed. The lot stabilization process is a conditioning process that is performed before the processing of the first wafer is started to stabilize the conditions in the process module PM.

Programs that cause the CPU 21 to execute recipes may be stored in a storage area or a storage medium such as the HDD 24 or the RAM 23. Also, such recipes and programs may be received from an external apparatus via a network.

The input-output I/F 25 is an interface that obtains input/output information from command operations performed by an operator to manage the substrate processing apparatus Sys. The display 26 chronologically displays the execution order of wafer processing and conditioning processes for each process module PM before wafers are processed according to a system recipe. The display 26 also displays other necessary information.

<Functional Configuration of Control Device>

Figure 2:
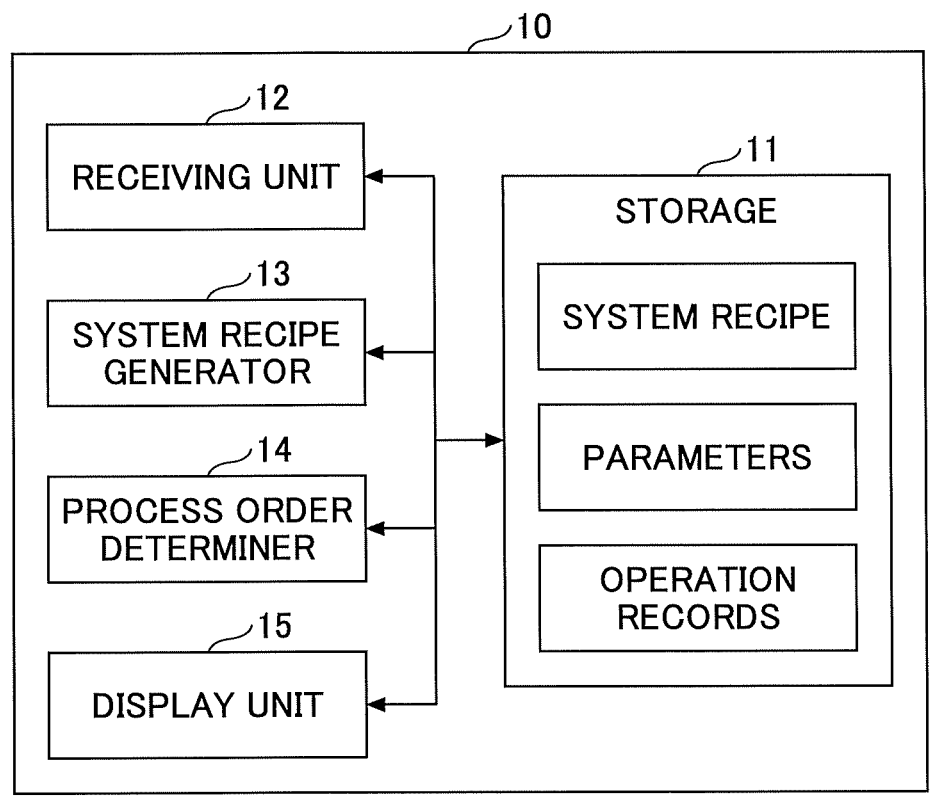
FIG. 2 is a drawing illustrating an example of a functional configuration of a control device for controlling a substrate processing apparatus.

Next, an example of a functional configuration of the control device 10 for controlling the substrate processing apparatus Sys is described with reference to FIG. 2. The control device 10 controls a wafer carrying process and wafer processing performed by the substrate processing apparatus Sys according to recipes. The control device 10 also visually displays the order of processes for each process module PM.

The control device 10 includes a storage 11, a receiving unit 12, a system recipe generator 13, a process order determiner 14, and a display unit 15.

The receiving unit 12 receives information on a wafer processing recipe and multiple conditioning recipes. The receiving unit 12 can also receive the number of wafers to be processed and other parameters.

The system recipe generator 13 selects the wafer processing recipe and the conditioning recipes from wafer processing recipes and conditioning recipes stored in the HDD 24 based on the received information, and generates a system recipe. The generated system recipe is stored in the storage 11.

The process order determiner 14 determines the order of executing wafer processing and conditioning processes in each process module PM based on processes and the timing of executing the processes defined in the system recipe. When parameters are also set, the process order determiner 14 determines the order of executing wafer processing and conditioning processes based on processes and execution timing defined in the system recipe and the set parameters.

The display unit 15 chronologically displays the execution order of the wafer processing and the conditioning processes. The display unit 15 displays the wafer processing and the conditioning processes in different colors based on their types. This makes it easier to understand the order and timing of processes to be executed in the process module PM. The display unit 15 may also display the number and type of wafers used in each of the wafer processing and the conditioning processes to be displayed. The display unit 15 may further display the time necessary to complete the wafer processing defined in the system recipe.

<Processes to be Executed Based on System Recipe and Timing of Executing Processes>

Next, examples of processes and the timing of executing the processes according to a system recipe are described. The process order determiner 14 determines the order of executing processes based on conditions indicating the timing when the processes are to be executed. When a recipe is input, "process" and "execution timing of process" defined in the recipe are set. When information such as the number of wafers to be processed can be specified when inputting a recipe, the specified information is also set. Also, there are items that can be set using parameters.

For example, when a wafer processing recipe is input, "wafer processing" is set as a process to be executed. When the number of wafers to be processed is input, the "number" of product wafers is set.

When pre-process cleaning, which is a type of cleaning process, is input, "pre-process cleaning" is set as a process to be executed. When the number of wafers to be processed is input, "number (0 or 1)" is set. The pre-process cleaning is executed at the start of a lot and immediately after the process module conditioning. As an execution condition that cannot be determined based solely on the recipe setting, it is possible to set a parameter indicating whether the pre-process cleaning is prevented during consecutive processing of multiple lots.

When count-designation cleaning, which is a type of cleaning process, is input, "count-designation cleaning" is set as a process to be executed. Also, the number of processed wafers per which the count-designation cleaning is performed is set. The count-designation cleaning is executed after a specified number of product or dummy wafers are processed. Also, it is possible to set a parameter indicating that the count-designation cleaning is not performed immediately after the last product wafer in the lot is processed. It is also possible to set a parameter indicating whether dummy wafers are counted as the number of processed wafers. Further, when multiple lots are processed consecutively, it is possible to set a parameter indicating whether the number of processed wafers is reset for each lot or is continuously counted across the lots. Parameters may be input via a setting screen that is different from a recipe input screen.

When post-process cleaning, which is a type of cleaning process, is input, "post-process cleaning" is set as a process to be executed. When the number of wafers to be processed is input, "number (0 or 1)" is set. The post-process cleaning is executed after a number of product wafers specified by a lot are processed.

When wafer-less dry cleaning is input, "WLDC" is set as a process to be executed. Whether the wafer-less dry cleaning is performed can be specified for each type of wafer to be processed. When product wafers are to be processed, the number of wafers can also be specified. The wafer-less dry cleaning is executed after wafer processing. When the number of wafers is specified, the wafer-less dry cleaning is executed every time when the specified number of product wafers are processed.

When NPPC is input, "NPPC" is set as a process to be executed. For NPPC, whether to execute NPPC and the number of times NPPC is executed may be specified. NPPC is executed after a lot is completed. The number of times NPPC is executed may be set as a fixed value instead of setting it in the recipe.

When the lot stabilization process is input, "lot stabilization process" is set as a process to be executed. Whether to execute the lot stabilization process, the number of times the lot stabilization process is executed, and a recipe for the lot stabilization process can be set in a system recipe. The lot stabilization process is executed at the start of a lot and after the pre-process cleaning. It is also possible to set a parameter indicating whether the lot stabilization process is prevented during consecutive processing of multiple lots.

When the seasoning (chamber conditioning process) is input, "seasoning (chamber conditioning process)" is set as a process to be executed. A process recipe for the seasoning may be specified in the system recipe or may be fixed by a parameter. The seasoning is executed immediately before the start of a lot and before the first wafer is carried into the process module PM.

An input using "smart conditioning function" may be received as "Steady State Conditioning Action (SSC)" or "Mini Conditioning (Mini)". When "SSC" is input, "SSC" representing at least one of dry cleaning, NPPC, and seasoning is set as a process to be executed. A number of product wafers to be processed can be specified as a condition to execute "SSC". Also, an actual process(es) to be executed as "SSC" can be specified. The execution order of "SSC" cannot be specified, and "SSC" is executed every time when the specified number of product wafers are processed. As an execution condition that cannot be determined based solely on the recipe setting, seasoning is not executed when consecutive processing of multiple lots is completed even if seasoning is specified as "SSC".

When "Mini" is input, "Mini" representing dry cleaning or seasoning is set as a process to be executed. A number of product wafers to be processed can be specified as a condition to execute "Mini". That is, "Mini" is executed every time when the specified number of product wafers are processed. As an execution condition that cannot be determined based solely on the recipe setting, SSC is preferentially executed and Mini is not executed when the execution timing of SSC and the execution timing of Mini coincide. Alternatively, when the execution timing of SSC and the execution timing of Mini coincide, both Mini and SSC may be executed in this order. In the present embodiment, when the execution timing of SSC and the execution timing of Mini coincide, SSC is preferentially executed and Mini is not executed.

The storage 11 may store a generated system recipe, set parameters, and an estimated processing time required to complete substrate processing defined by the system recipe.

<Execution Order Display Process>

Figure 3:
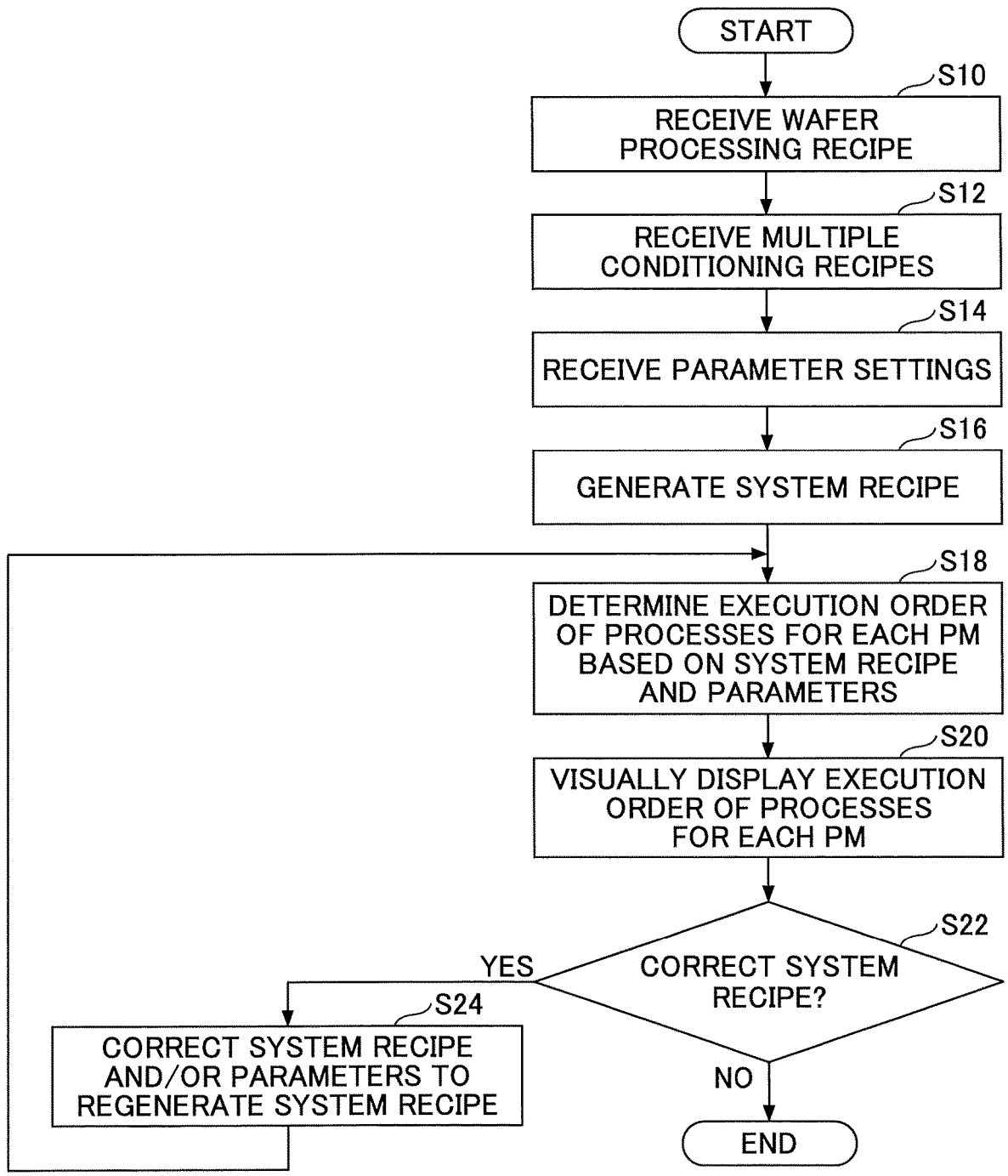
FIG. 3 is a flowchart illustrating an example of an execution order display process.

Next, an example of an execution order display process according to an embodiment is described with reference to FIG. 3. FIG. 3 is a flowchart illustrating an example of an execution order display process according to an embodiment. When the processing-order display process is started, the receiving unit 12 receives an wafer processing recipe (step S10). Next, the receiving unit 12 receives multiple conditioning recipes (step S12). Next, the receiving unit 12 receives parameter settings (step S14).

The system recipe generator 13 generates a system recipe indicating the execution procedure of the received wafer processing recipe and the received conditioning recipes (step S16). The process order determiner 14 determines the execution order of the wafer processing and the conditioning processes for each process module PM based on the generated system recipe and the parameter settings (step S18). Conditions for determining the execution order include not only the settings in the recipes but also information (e.g., the number of processed product wafers that is used as a condition to execute a cleaning process) that is input together with the recipes and various parameters.

Next, the display unit 15 visually displays the execution order of the wafer processing and the conditioning processes for each process module PM (step S20). Then, the system recipe generator 13 determines whether to correct the system recipe (step S22).

When the receiving unit 12 receives a correction request to correct the system recipe from a user, the system recipe generator 13 determines to correct the system recipe. In this case, the system recipe generator 13 corrects at least one of the system recipe and the parameter settings, and regenerates the system recipe (step S24). After the system recipe is regenerated, steps S18 and S20 are performed again to visually display the execution order of the wafer processing and the conditioning processes for each process module PM according to the regenerated system recipe and the parameter settings in real time. When the system recipe generator 13 determines not to correct the system recipe at step S22, the execution order display process ends.

FIG. 4 is a drawing illustrating an example of a system recipe setting screen A1. In the system recipe setting screen A1, "Module" indicates a field for setting modules defining a route through which a wafer is carried. The system recipe setting screen A1 of FIG. 4 defines processes to be executed in the process module PM1 and the execution timing of the processes. For example, "Cleaning Timing" indicates a field where the execution timing of cleaning processes is set. "Pre&Post-Process 5 wafers" indicates that cleaning processes are executed at the beginning of a lot, at the end of the lot, and every time when five wafers are processed.

"Recipe Individual" in the "Individual Setting" field indicates that fields are set individually for respective recipes. "Pre-Process Cleaning Recipe" is a field for setting pre-process cleaning. "Count Designation Cleaning Recipe" is a field for setting count-designation cleaning. "Post-Process Cleaning Recipe" is a field for setting post-process cleaning.

Figure 5:
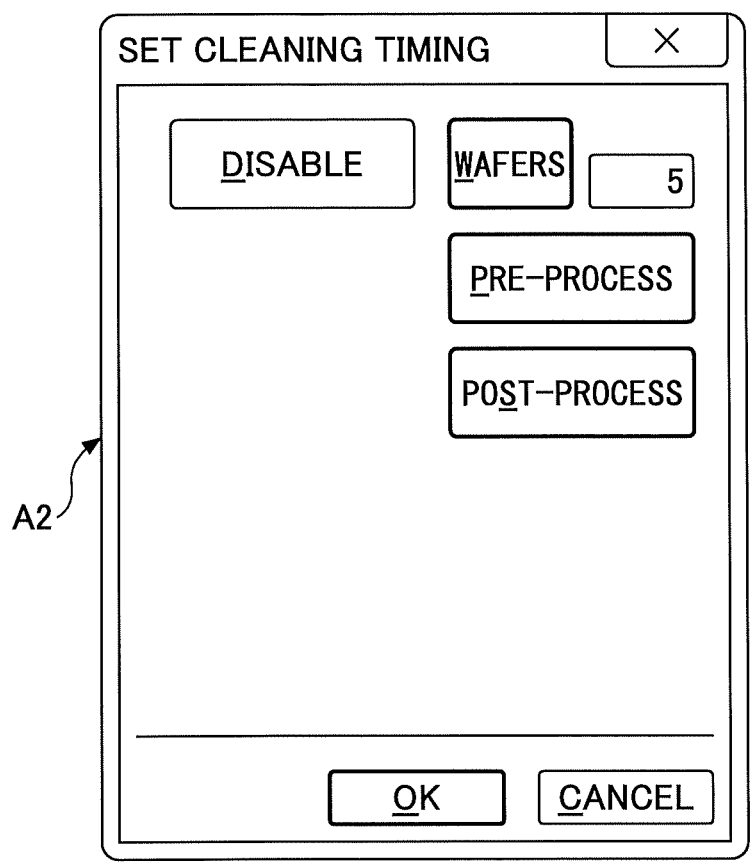
FIG. 5 is a drawing illustrating an example of a cleaning timing setting screen.

In the present embodiment, the control device is in a mode where the execution timing is set separately for each cleaning process. FIG. 5 is a drawing illustrating an example of a cleaning timing setting screen A2. When the control device 10 is in a mode to automatically set the execution timing of cleaning processes, manual setting of the execution timing as illustrated by FIG. 5 is not necessary.

In FIG. 5, "Pre-Process", "Post-Process", and "wafers" buttons are selected, "5" is entered in a field indicating the number of wafers, and an "OK button is pressed. These settings indicate that cleaning processes are executed at the beginning of a lot, at the end of the lot, and every time when five wafers are processed.

The system recipe settings in FIG. 4 are displayed in a tabular format. Therefore, it is difficult to understand the timing when the processes are executed. For this reason, in the present embodiment, the execution order of wafer processing and multiple conditioning processes is chronologically displayed for each process module based on system recipe settings and parameter settings.

Figure 6:
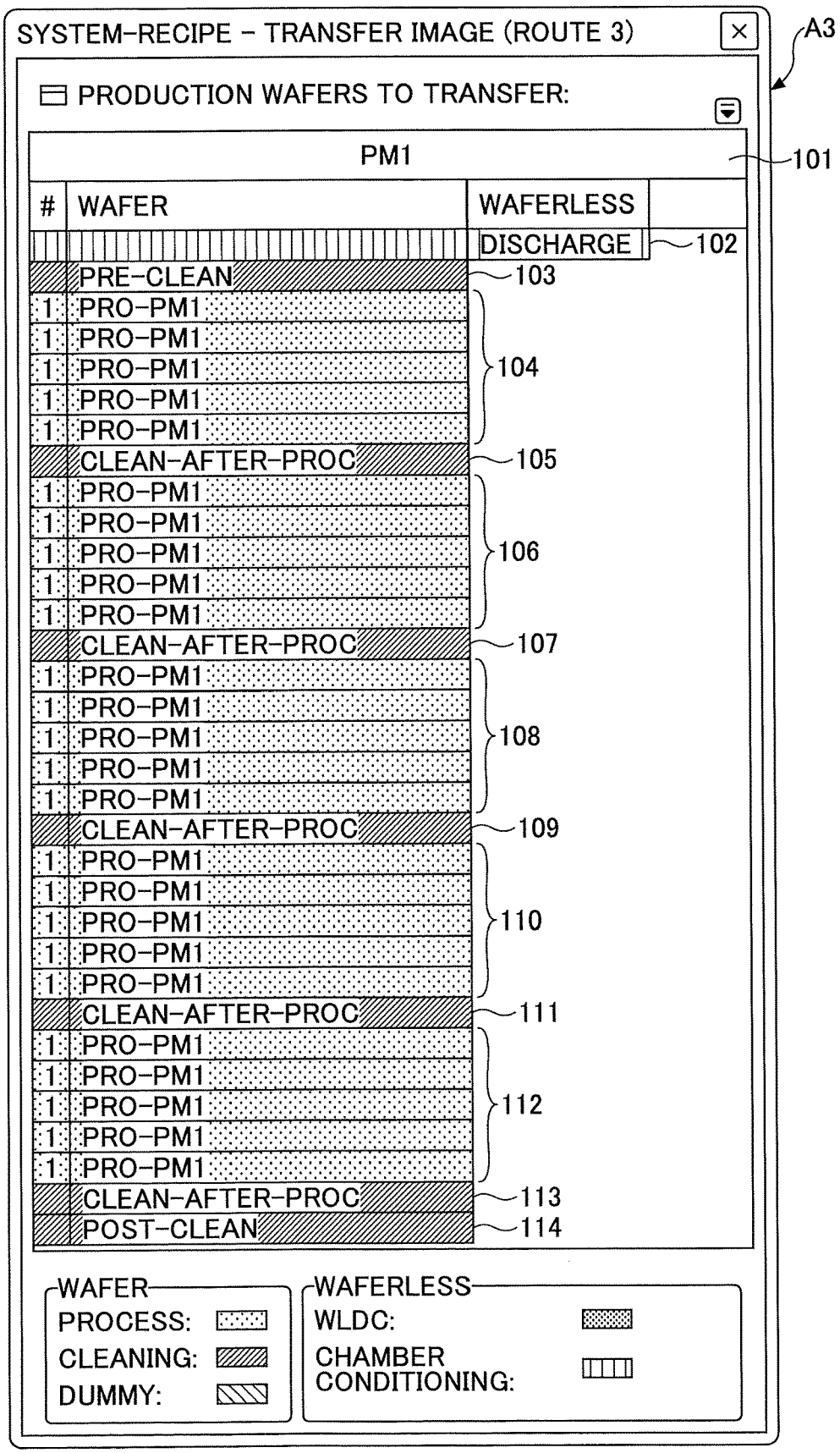
FIG. 6 is a drawing illustrating an example of an execution order display screen displayed based on conditions set in FIGS. 4 and 5.

FIG. 6 illustrates an example of an execution order display screen A3 that chronologically displays the execution order of wafer processing and multiple conditioning processes which is obtained by the control device 10 by performing the execution order display process of FIG. 3 based on the settings and parameter values input via the setting screens illustrated in FIGS. 4 and 5. In FIG. 6, a field 101 contains "PM1" indicating the process module PM1 where processes are to be executed. In this example, it is assumed that all of 25 wafers in one lot are processed in the process module PM1.

In the example of FIG. 6, after a static electricity removal process 102 is executed, pre-process cleaning (PRE-CLEAN) 103 is executed at the beginning of the lot. Next, wafer processing 104 is executed for five wafers, and then count-designation cleaning (CLEAN-AFTER-PROC) 105 is executed. Similarly, wafer processing 106 for five wafers, count-designation cleaning 107, wafer processing 108 for five wafers, count-designation cleaning 109, wafer processing 110 for five wafers, count-designation cleaning 111, wafer processing 112 for five wafers, and count-designation cleaning 113 are executed. Then, at the end of the lot, post-process cleaning (POST-CLEAN) 114 is executed.

FIG. 7 is a drawing illustrating an example of a route setting screen A4 for setting a route in a system recipe. According to the example of FIG. 7, 25 wafers in one lot are carried through the load port LPC into the load lock module LLM1 or LLM2, and then carried into the process module PM1 and the process module PM2 where the wafers are processed. After being processed, the wafers are carried into the load lock module LLM1 or LLM2, and then carried out of the substrate processing apparatus Sys through the load port LPC. Wafer processing can be performed concurrently in the process module PM1 and the process module PM2.

In the present embodiment, the route setting screen for the system recipe is updated in real time according to changes in set conditions. That is, when changes are made to the system recipe settings and the parameter settings, the execution order display process of FIG. 3 is started to update the execution order based on changed settings, and the screen is updated so that the updated execution order is chronologically displayed.

Figure 8:
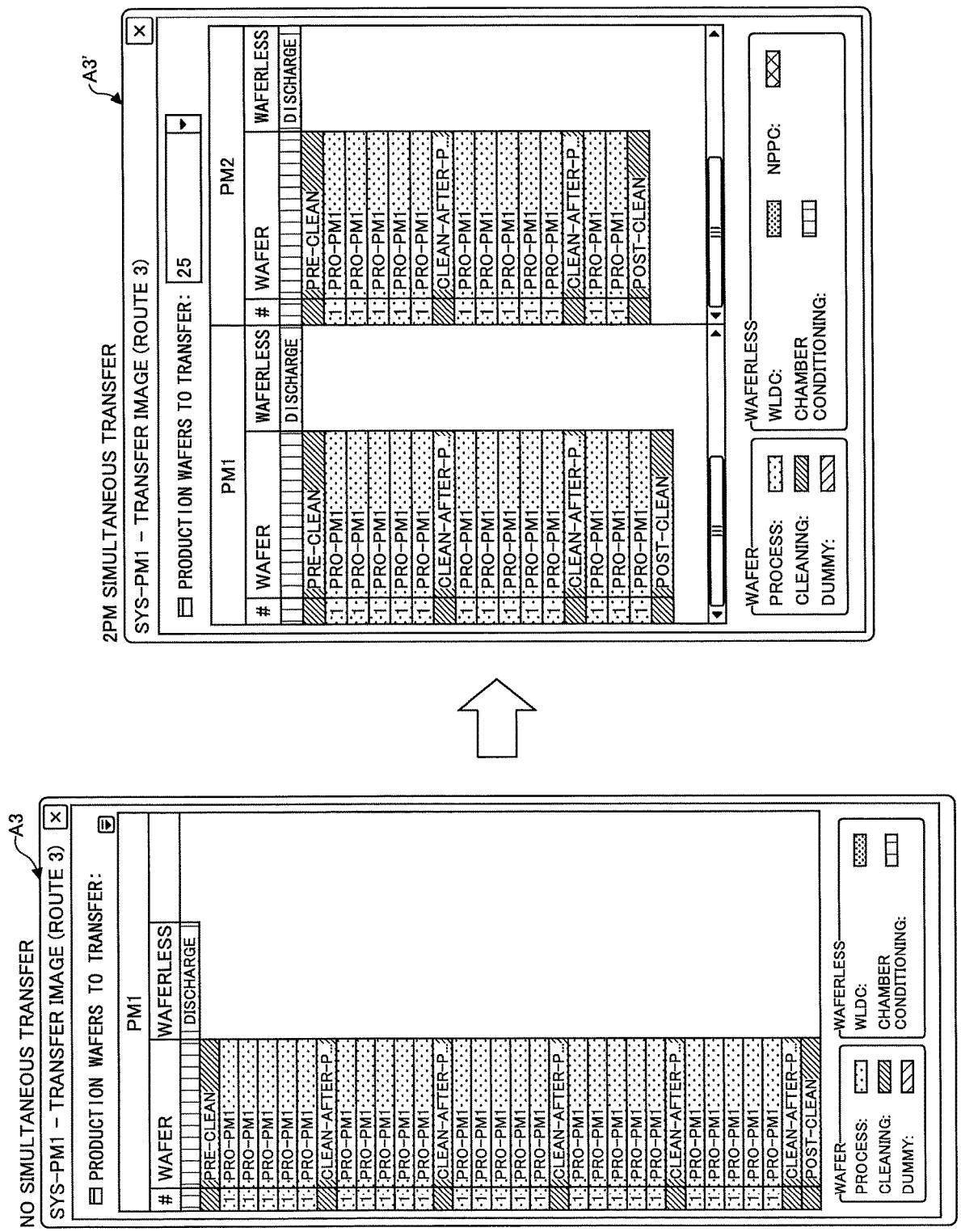
FIG. 8 is a drawing illustrating an execution order display screen where concurrent transfer is not performed and an execution order display screen where concurrent transfer is performed.

In the example of FIG. 8, the execution order display screen A3 for a case where concurrent transfer is not performed is updated to an execution order display screen A3' for a case where concurrent transfer is performed. The execution order display screen A3 chronologically displays the execution order of wafer processing and multiple conditioning processes in a case where concurrent transfer of wafers to multiple process modules is not performed (i.e., wafers are processed using only the process module PM1). The execution order display screen A3' chronologically displays the execution order of wafer processing and multiple conditioning processes in a case where wafers are transferred concurrently to the process module PM1 and the process module PM2 (i.e., a case where the process module PM1 and the process module PM2 are concurrently used).

Figure 9:
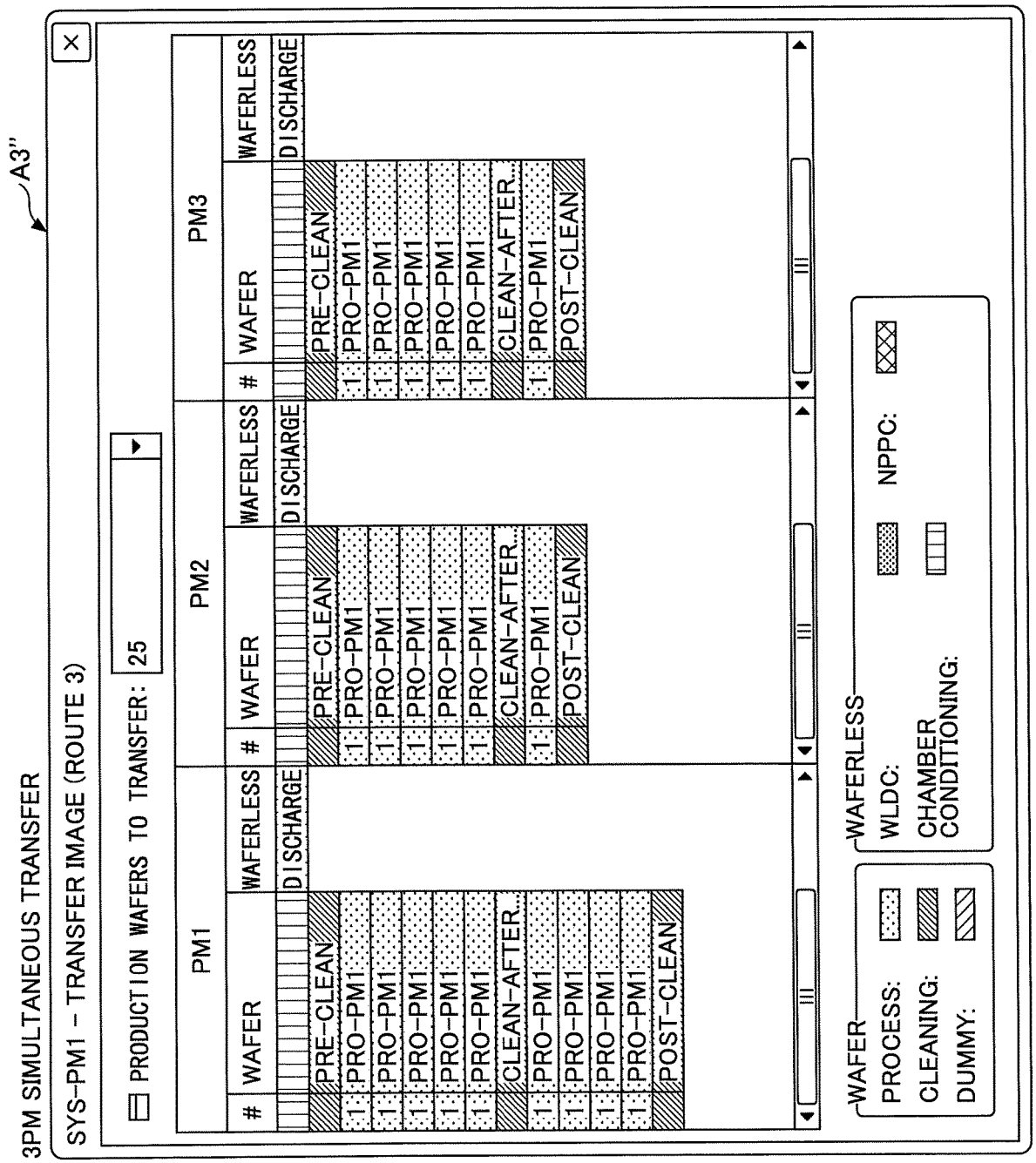
FIG. 9 is a drawing illustrating an example of an execution order display screen where concurrent transfer is performed.

Here, assume that the process module setting is changed from "PM1 or PM2" to "PM1 or PM2 or PM3" by using the route setting screen A4 of FIG. 7. FIG. 9 illustrates an execution order display screen A3" that is displayed as a result of changing the process module setting from "PM1 or PM2" to "PM1 or PM2 or PM3". The execution order display screen A3" chronologically displays the execution order of wafer processing and multiple conditioning processes in a case where wafers are transferred concurrently to the process module PM1, the process module PM2, and the process module PM3.

Thus, the present embodiment makes it possible to chronologically display the execution order of processes for each process module PM. This enables the user to visually understand the execution order of wafer processing and multiple conditioning processes for each process module. This in turn enables the user to easily confirm whether an intended system recipe has been generated.

Also in the above embodiment, different colors are used for different types of processes, and process recipes are indicated by text. This in turn makes it possible to prevent forgetting to set a necessary item.

Even when wafers are transferred concurrently to multiple process modules PM, the control device 10 of the present embodiment makes it possible to understand the execution order of processes in each of the process modules PM in real time. This in turn makes it possible to confirm the execution order of processes when generating a system recipe, i.e., before actually executing wafer processing, and to regenerate a system recipe where processes are executed in the optimized order based on the confirmation results.

<First Variation>

Figure 10B:
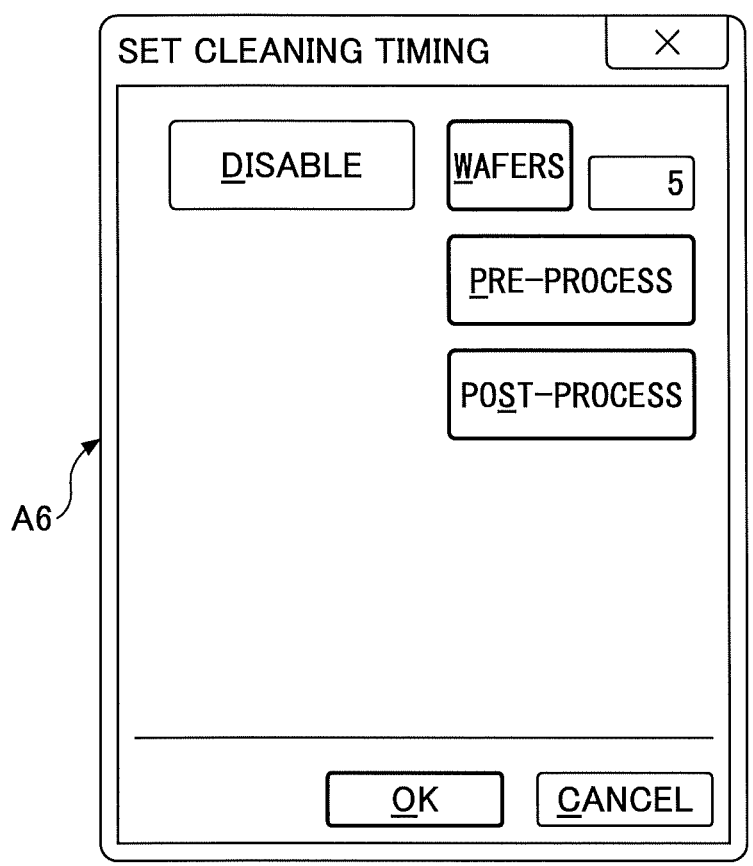
FIG. 10B is a drawing illustrating a cleaning timing setting screen according to the first variation.

Next, setting screens and an execution order display screen according to a first variation of the present embodiment are described with reference to FIGS. 10A, 10B, and 11. FIG. 10A illustrates a system recipe setting screen A5 and FIG. 10B illustrates a cleaning timing setting screen A6 according to the first variation.

The system recipe setting screen A5 of the first variation is different from the system recipe setting screen A1 of FIG. 4 in that the process modules PM1 through PM5 are set in the module field of the system recipe setting screen A5 while only the process module PM1 is set in the system recipe setting screen A1. The cleaning timing setting screen A6 is the same as the cleaning timing setting screen A2 of FIG. 5, and indicates that cleaning processes are executed at the beginning of a lot, at the end of the lot, and every time when five wafers are processed.

Figure 11:
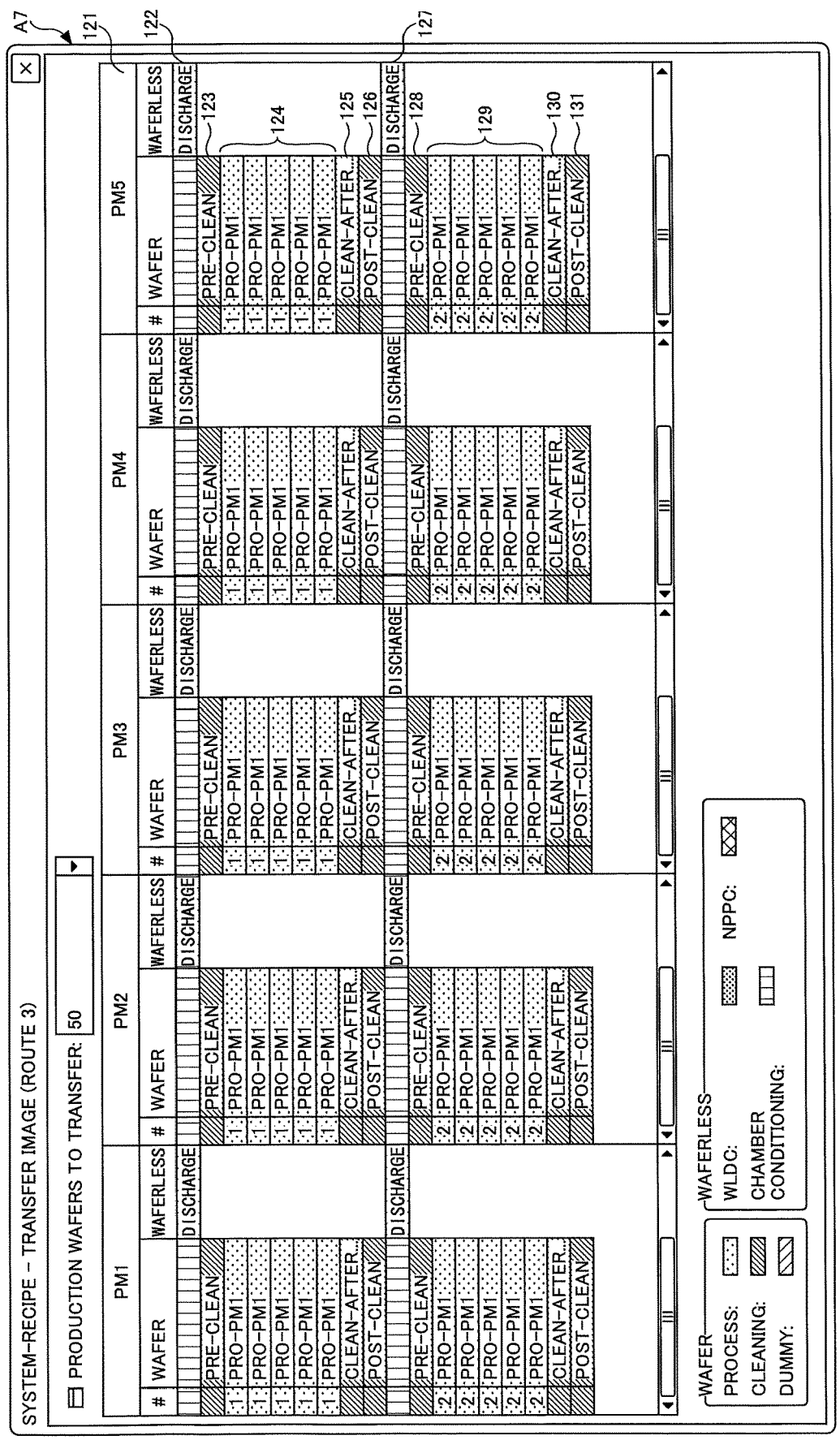
FIG. 11 is a drawing illustrating an example of an execution order display screen displayed based on conditions set in FIGS. 10A and 10B.

FIG. 11 illustrates an execution order display screen A7 that chronologically displays the execution order of wafer processing and multiple conditioning processes which is obtained by the control device 10 by performing the execution order display process of FIG. 3 based on the settings and parameter values input via the setting screens illustrated in FIGS. 10A and 10B.

In FIG. 10A, the processes to be executed in the process modules PM1 through PM5 are displayed in a tabular form, and therefore it is difficult to understand the chronological execution order of processes performed in each of the process modules PM1 through PM5.

In contrast, the execution order display screen A7 of FIG. 11 chronologically and visually displays the execution order of wafer processing and multiple conditioning processes which is obtained by the control device 10 by performing the execution order display process of FIG. 3 based on the settings input via the setting screens illustrated in FIGS. 10A and 10B. The execution order display screen A7 of FIG. 11 chronologically displays the execution order of the wafer processing and the conditioning processes separately for each of the process modules PM1 through PM5. In the example of FIG. 11, in each of the process modules PM1 through PM5, after a static electricity removal process 122 is executed, pre-process cleaning (PRE-CLEAN) 123 is executed at the beginning of a lot including 25 wafers. After wafer processing 124 is executed for five wafers, count-designation cleaning (CLEAN-AFTER-PROC) 125 is executed, and then post-process cleaning (POST-CLEAN) 126 is executed at the end of the lot.

The above procedure is repeated in each of the process modules PM1 through PM5. That is, in each of the process modules PM1 through PM5, a static electricity removal process 127, pre-process cleaning (PRE-CLEAN) 128, wafer processing 129 for five wafers, count-designation cleaning (CLEAN-AFTER-PROC) 130, and post-process cleaning (POST-CLEAN) 131 are executed in this order.

As described above, according to the substrate processing display methods of the embodiment and the first variation, it is possible to display, on the same screen, the execution orders of processes for all process modules to which wafers are concurrently transferred. Based on the comparison between the embodiment and the first variation, it is found out that the execution orders of processes displayed for respective process modules vary depending on the number of concurrently-used process modules even when system recipes are defined in a similar manner.

<Second Variation>

Figures 12B, 12C:
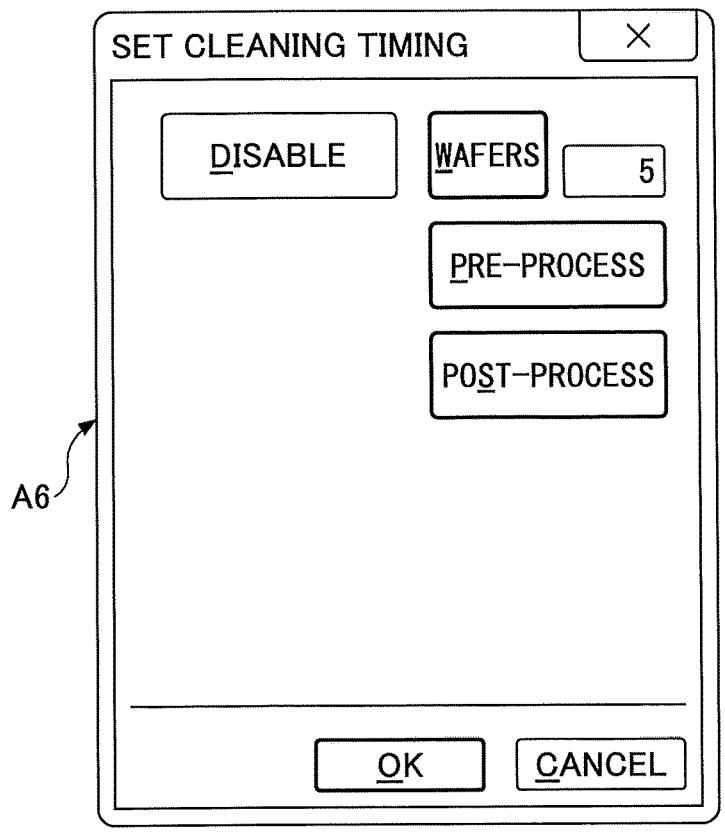
FIG. 12B is a drawing illustrating a cleaning timing setting screen according to the second variation.
FIG. 12C is a drawing illustrating a parameter setting screen according to the second variation.

Next, setting screens and an execution order display screen according to a second variation are described with reference to FIGS. 12A, 12B, 12C, and 13. FIG. 12A illustrates a system recipe setting screen A5, FIG. 12B illustrates a cleaning timing setting screen A6, and FIG. 12C illustrates a parameter (device parameter) setting screen A8 according to the second variation.

The system recipe setting screen A5 of FIG. 12A and the cleaning timing setting screen A6 of FIG. 12B are the same as those of the first variation illustrated in FIGS. 10A and 10B. In the second variation, on the parameter setting screen A8, a parameter for "PM-use-count cleaning function" is enabled. This parameter is disabled in the first variation. When "PM-use-count cleaning function" is enabled and the timing of the count-designation cleaning and the timing of the post-process cleaning coincide, the post-process cleaning is not executed. Thus, the system recipe settings and the cleaning timing settings in the second variation are the same as those in the first variation, but the parameter settings in the second variation are different from those in the first variation.

Figure 13:
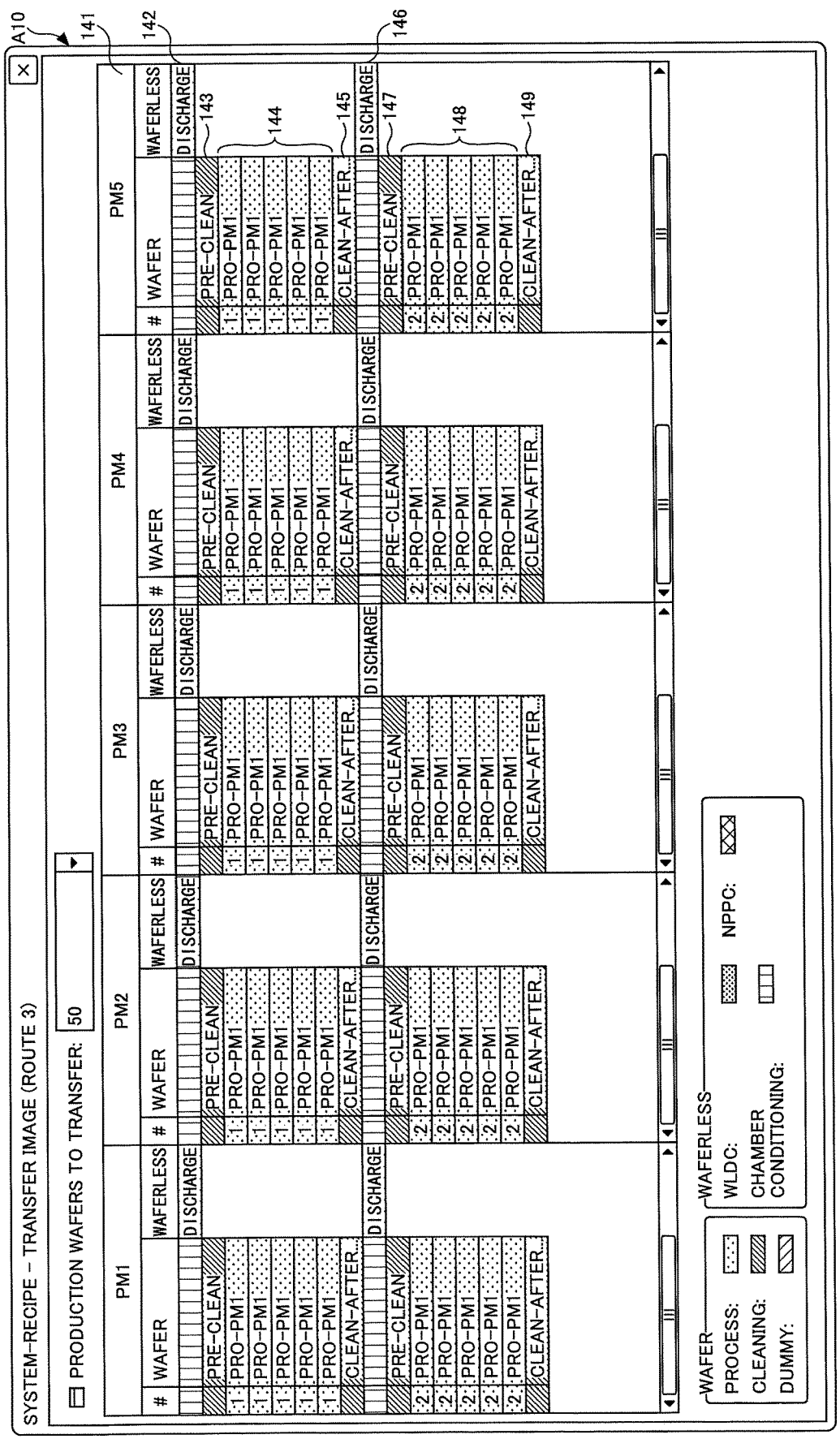
FIG. 13 is a drawing illustrating an example of an execution order display screen displayed based on conditions set in FIGS. 12A through 12C.

FIG. 13 illustrates an execution order display screen A10 that chronologically displays the execution order of wafer processing and multiple conditioning processes which is obtained by the control device 10 by performing the execution order display process of FIG. 3 based on the settings and parameter values input via the setting screens illustrated in FIGS. 12A, 12B, and 12C.

The execution order display screen A10 of FIG. displayed according to the second variation is apparently different from the execution order display screen A7 of FIG. 11 displayed according to the first variation.

In the execution order display screen A7 of FIG. 11 according to the first variation, in each of the process modules PM1 through PM5, the static electricity removal process 122, the pre-process cleaning 123, the wafer processing 124 for five wafers, the count-designation cleaning 125, and the post-process cleaning 126 are executed in this order.

In contrast, in the execution order display screen A10 of FIG. 13 according to the second variation, in each of the process modules PM1 through PM5, a static electricity removal process 142, pre-process cleaning 143, wafer processing 144 for five wafers, and count-designation cleaning 145 are executed in this order. Thus, with the execution order display screen A10 of the second variation, it is clearly understandable that the post-process cleaning set in the system recipe is not executed because the timing of the count-designation cleaning and the timing of the post-process cleaning coincide.

Information on the execution order display screen A7 of FIG. 11 may be stored in the storage 11 so that the execution order display screens A7 and A10 with different recipe settings and parameter settings can be alternately displayed on the same screen or on different screens. This in turn makes it possible to improve the convenience for the user in generating a system recipe.

As described above, according to the substrate processing display method of the second variation, it is possible to visualize processes that are prevented or added according to combinations of recipe settings and parameter settings. In the related-art technology, the logic in wafer processing is determined by the substrate processing apparatus Sys when executing a system recipe. In contrast, the second variation makes it possible to reproduce the logic in wafer processing while editing a system recipe. This in turn makes it possible to optimize a recipe before executing the recipe. In other words, the second variation makes it possible to generate a proper system recipe without actually executing processes according to the system recipe, and makes it possible to improve the efficiency in generating system recipes. Further, when actually processing product wafers, processes can be executed in the optimized execution order according to the properly generated system recipe. Thus, the second variation can also improve the processing efficiency and increase the throughput.

<Third Variation>

Figure 14A:
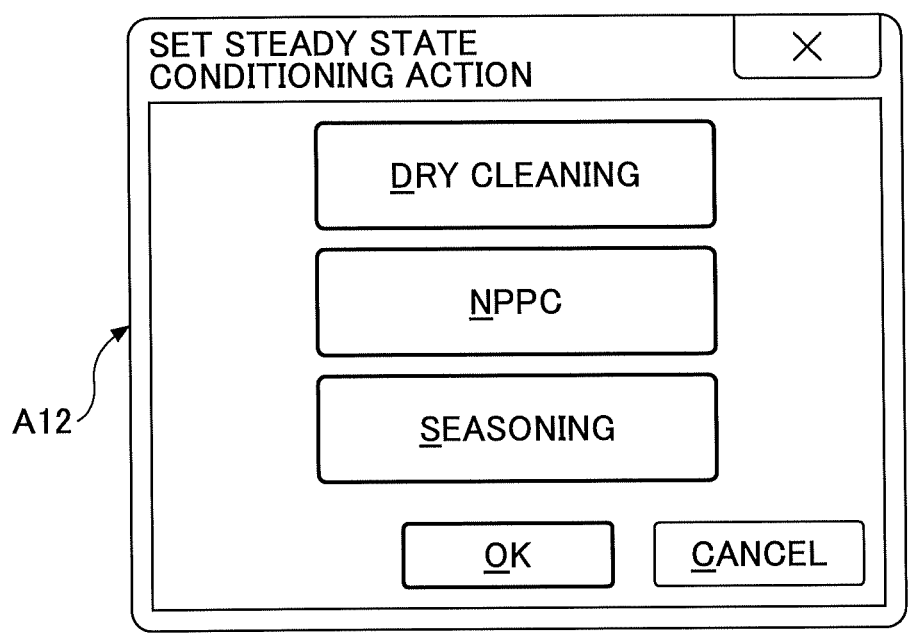
FIG. 14A is a drawing illustrating a parameter setting screen according to a third variation.
Figure 14B:
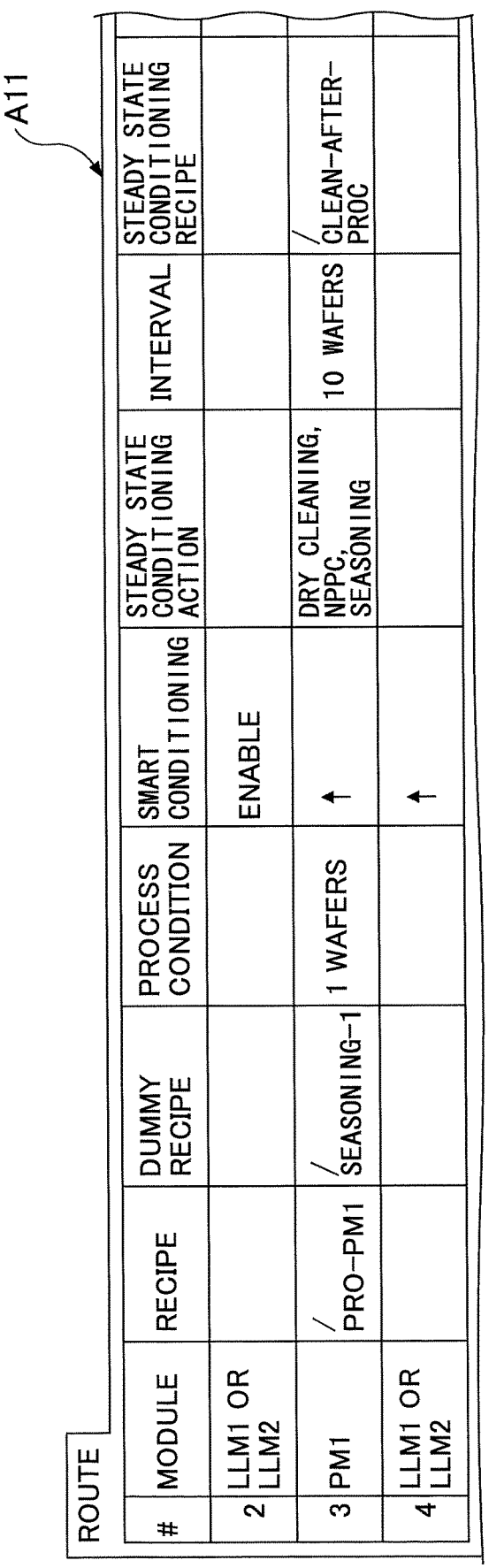
FIG. 14B is a drawing illustrating a system recipe setting screen according to the third variation.

Next, setting screens and an execution order display screen according to a third variation are described with reference to FIGS. 14A, 14B, and 15. FIG. 14A illustrates a parameter setting screen A12 and FIG. 14B illustrates a system recipe setting screen A11 according to the third variation.

In the third variation, it is assumed that "smart conditioning function" is enabled. When the "smart conditioning function" is enabled, processes unnecessary during consecutive processing of multiple lots are prevented as much as possible, and post processing is automatically added at the end of the consecutive processing of multiple lots.

When the "smart conditioning function" is enabled, one or more processes executed as the Steady State Conditioning Action (SSC) can be selected from dry cleaning, NPPC, and seasoning on the parameter setting screen A12 of FIG. 14A. In the example of FIG. 14A, all of dry cleaning, NPPC, and seasoning are selected and the OK button is pressed. Accordingly, in the third variation, dry cleaning, NPPC, and seasoning are executed as "SSC". According to the system recipe setting screen A11 of FIG. 14B, "Smart Conditioning" is enabled, and dry cleaning, NPPC, and seasoning are executed as "SSC" every time when 10 wafers are processed. As a default, NPPC is also executed at the end of each lot.

"Dummy Recipe" and "Process Condition" fields in the system recipe setting screen A11 indicate that one dummy wafer is supplied and processed according to a dummy recipe before the processing of each lot.

FIG. 15 illustrates an execution order display screen A13 that chronologically displays the execution order of wafer processing and multiple conditioning processes which is obtained by the control device 10 by performing the execution order display process of FIG. 3 based on the settings and parameter values input via the setting screens illustrated in FIGS. 14A and 14B.

The execution order display screen A13 of FIG. 15 chronologically displays processes for processing 25 wafers constituting a lot in the process module PM1. First, a static electricity removal process 152 is executed, and seasoning 153 is executed as "SSC". Next, wafer processing 154 is executed for 10 wafers, dry cleaning 155 and NPPC 156 are executed as "SSC", and seasoning 157 is executed as "SSC". Then, wafer processing 158 is executed for 10 wafers again, and dry cleaning 159, NPPC 160, and seasoning 161 are executed as "SSC". After wafer processing 162 is executed for the last five wafers, dry cleaning 163 and NPPC 164 are executed as "SSC".

Figure 16:
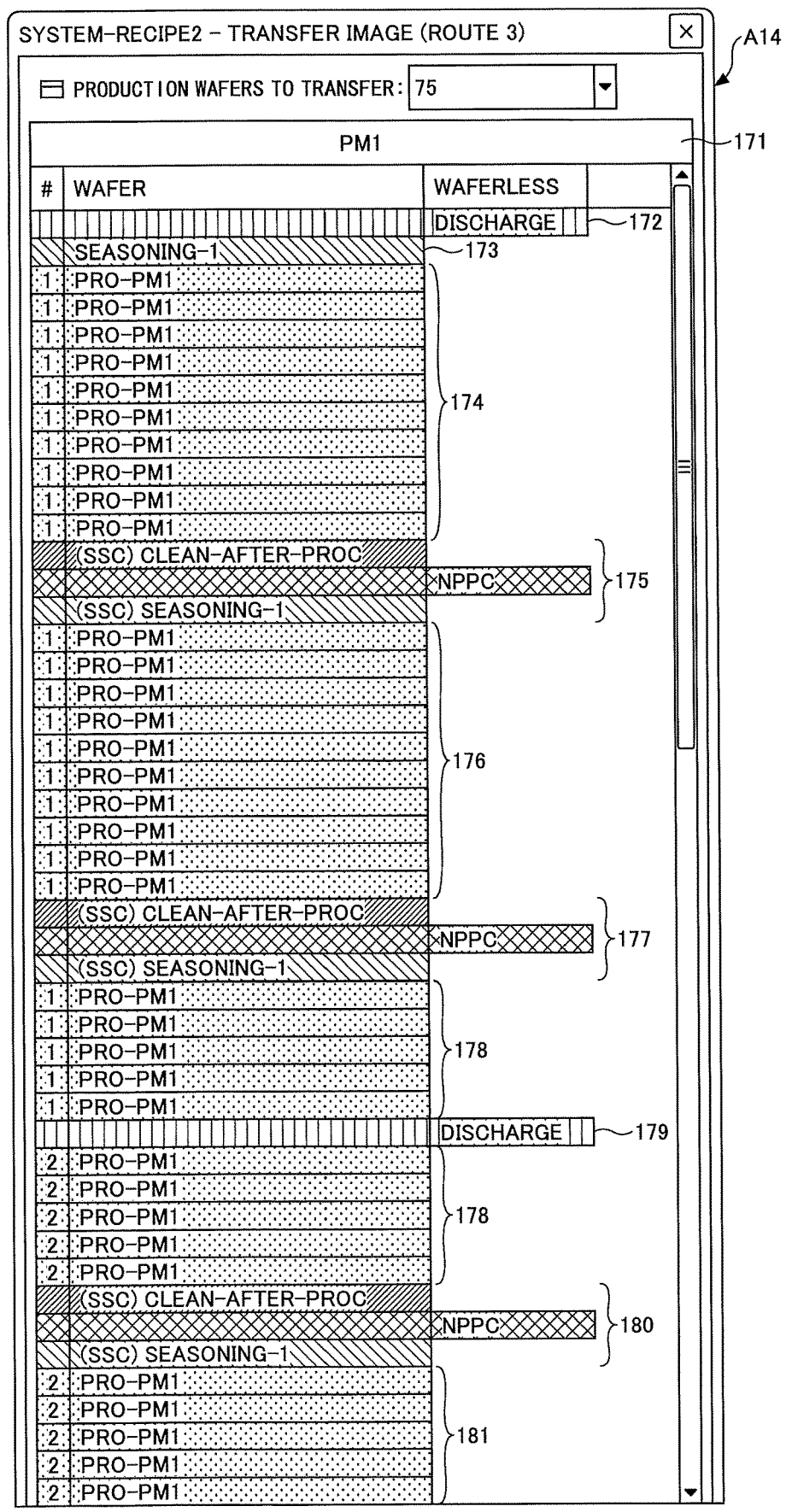
FIG. 16 is a drawing illustrating a part of an execution order display screen.
Figure 17:
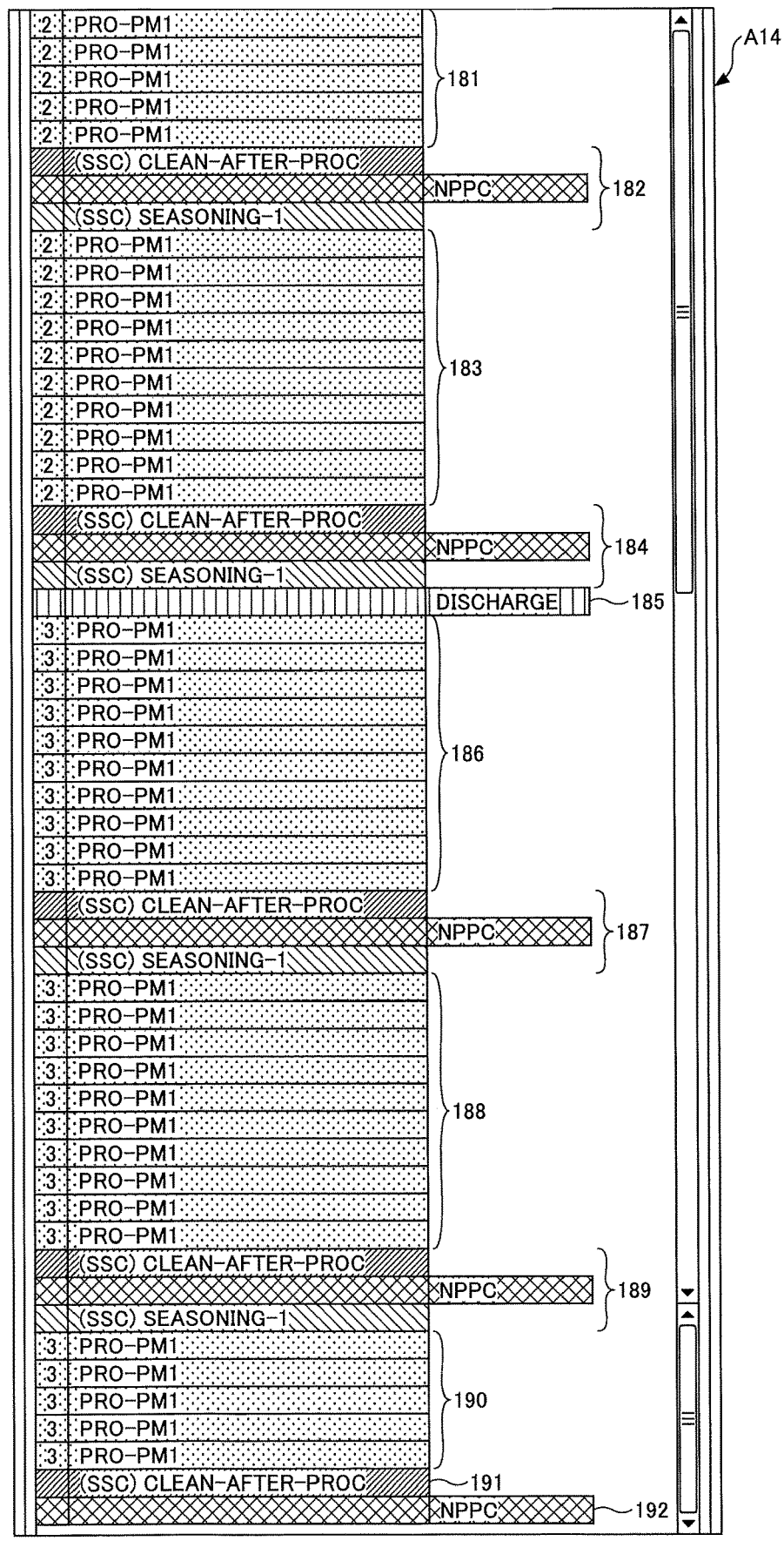
FIG. 17 is a drawing illustrating a subsequent part of the execution order display screen of FIG. 16.

FIGS. 16 and 17 illustrate an execution order display screen A14 that displays processes for processing 75 wafers constituting three lots in the process module PM1 based on the system recipe settings and the parameter settings in FIGS. 14A and 14B.

In the execution order display screen A14, as illustrated in FIGS. 16 and 17, static electricity removal processes 172, 179, and 185 are executed at the ends of the corresponding lots. After the static electricity removal process 172, seasoning 173 is executed. After each wafer processing 174, 176, 178, 181, 183, 186, and 188 is executed for 10 wafers, the corresponding one of "SSC" 175, 177, 180, 182, 184, 187, and 189 is executed. After wafer processing 190 is executed for the last five wafers, dry cleaning 191 and NPPC 192 are executed as "SSC".

As described above, the substrate processing display methods according to the embodiment and the variations make it possible to easily understand the sequence of processes to be executed in each process module to process substrates. Also, the above-described embodiment and variations make it possible to visualize processes that are prevented or added according to combinations of recipe settings and parameter settings. Also, the above-described embodiment and variations make it possible to set a combination of parameter settings using the "smart conditioning function" and to visualize processes that are prevented or added according to the combination of parameter settings. In the related-art technology, the logic in wafer processing is determined by the substrate processing apparatus Sys when executing a system recipe. In contrast, the above-described embodiment and variations make it possible to reproduce the logic in wafer processing while editing a system recipe. This in turn makes it possible to optimize a recipe before executing the recipe. Thus, the above-described embodiment and variations make it possible to improve the efficiency in generating system recipes. Further, when actually processing product wafers, processes can be executed in the optimized execution order according to the properly generated system recipe. Thus, the above-described embodiment and variations can also improve the processing efficiency and increase the throughput.

As illustrated in FIG. 15, a number of wafers A and a wafer type D may be displayed for each of wafer processing and conditioning processes. In the wafer type D, either "product wafer" or "dummy wafer" is displayed. A process that uses no wafer is indicated by a "wafer-less" field C. For example, NPPC is executed using no wafer.

The control device 10 may be configured to calculate and display an estimated processing time E necessary to complete the wafer processing defined by a system recipe based on time information provided for each process B. Estimated processing times calculated previously may be stored in the storage 11 as operation records. In this case, the control device 10 may be configured to calculate and display a time necessary to complete wafer processing for one lot of wafers based on the operation records or values set in recipes to provide a material for the user to determine the quality of a generated system recipe.

A control device for controlling a substrate processing apparatus and substrate processing display methods according to the embodiment are described above. However, the present invention is not limited to the specifically disclosed embodiments, and variations and modifications may be made without departing from the scope of the present invention. Also, the embodiments and variations may be combined as long as they do not conflict with each other.

The substrate processing apparatus Sys may be a capacitively-coupled plasma (CCP) apparatus, an inductively-coupled plasma (ICP) processing apparatus, a plasma processing apparatus using a radial line slot antenna, a helicon wave plasma (HWP) apparatus, an electron cyclotron resonance (ECR) plasma apparatus, or a surface-wave plasma processing apparatus. Also, the substrate processing apparatus Sys may be an apparatus that processes a substrate using, for example, heat and without using plasma.

Although a wafer is used as an example of a substrate in the above embodiment, the substrate is not limited to a wafer. For example, the substrate may also be a board used for a liquid crystal display (LCD) or a flat panel display (FPD), a photomask, a CD substrate, or a printed-circuit board.

An aspect of this disclosure provides a device for controlling a substrate processing apparatus and a method for displaying substrate processing that make it possible to easily recognize the sequence of processes executed in a process module before actually performing substrate processing according to a system recipe.

What is claimed is:

1. A device for controlling a substrate processing apparatus that includes process modules for processing substrates, the device comprising:
a memory that stores a program; and
a processor that executes the program stored in the memory to perform a process, the process including
receiving a substrate processing recipe defining substrate processing and conditioning recipes defining conditioning processes from a storage storing the substrate processing recipe and the conditioning recipes, the conditioning processes including pre-process cleaning performed at a beginning of a lot including processing of a predetermined number of substrates, count-designation cleaning performed each time a number of substrates specified on a setting screen are processed during the processing of the lot, and post-process cleaning performed at an end of the lot,
receiving parameters including the number of substrates from the setting screen,
generating a system recipe indicating an execution procedure of the received substrate processing recipe and the received conditioning recipes,
determining an execution order of the substrate processing and the conditioning processes for each of the process modules based on the system recipe and the parameters,
before controlling the substrate processing apparatus to process the substrates according to the system recipe, chronologically displaying the execution order of the substrate processing and the conditioning processes for each of the process modules, and controlling the substrate processing apparatus to process the substrates according to the system recipe and the execution order.

2. The device as claimed in claim 1, wherein in the displaying, a number and a type of substrates to be processed in each of the substrate processing and the conditioning processes are also displayed.

3. The device as claimed in claim 2, wherein the type of the substrates is one of a product substrate, a dummy substrate, and no substrate.

4. The device as claimed in claim 1, wherein in the displaying, a time necessary to complete the substrate processing defined in the system recipe is also displayed.

5. The device as claimed in claim 1, wherein the conditioning recipes include at least one of recipes for executing dry cleaning, wafer-less dry cleaning, seasoning, non-plasma particle cleaning (NPPC), and a lot stabilization process.

6. The device as claimed in claim 1, wherein in the displaying, execution orders of the substrate processing and the conditioning processes for the respective process modules are displayed on a same screen.

7. The device as claimed in claim 1, wherein in the displaying, the execution order of the substrate processing and the conditioning processes for each of the process modules is determined based also on information indicating order of priority of the received substrate processing recipe and the received conditioning recipes.

8. A method performed by a device for controlling a substrate processing apparatus that includes process modules for processing substrates, the method comprising:
receiving a substrate processing recipe defining substrate processing and conditioning recipes defining conditioning processes from a storage storing the substrate processing recipe and the conditioning recipes, the conditioning processes including pre-process cleaning performed at a beginning of a lot including processing of a predetermined number of substrates, count-designation cleaning performed each time a number of substrates specified on a setting screen are processed during the processing of the lot, and post-process cleaning performed at an end of the lot;
receiving parameters including the number of substrates from the setting screen;
generating a system recipe indicating an execution procedure of the received substrate processing recipe and the received conditioning recipes,
determining an execution order of the substrate processing and the conditioning processes for each of the process modules based on the system recipe and the parameters;
before controlling the substrate processing apparatus to process the substrates according to the system recipe, chronologically displaying the execution order of the substrate processing and the conditioning processes for each of the process modules; and
controlling the substrate processing apparatus to process the substrates according to the system recipe and the execution order.

9. The method as claimed in claim 8, further comprising:
receiving a request to correct the system recipe;
correcting the system recipe based on the received request;
redetermining the execution order of the substrate processing and the conditioning processes for each of the process modules based on the corrected system recipe and the parameters; and
before controlling the substrate processing apparatus to process the substrates according to the corrected system recipe, chronologically displaying the redetermined execution order of the substrate processing and the conditioning processes for each of the process modules.

* * * * *